United States Patent
Kagami et al.

(10) Patent No.: US 8,579,648 B2
(45) Date of Patent: Nov. 12, 2013

(54) COMPONENT FOR ELECTRONIC APPARATUS

(75) Inventors: Shu Kagami, Nagoya (JP); Jun Kondo, Nagoya (JP); Kazufumi Serizawa, Kariya (JP)

(73) Assignee: Denso Corporation, Kariya (JP)

( * ) Notice: Subject to any disclaimer, the term of this patent is extended or adjusted under 35 U.S.C. 154(b) by 29 days.

(21) Appl. No.: 13/306,014

(22) Filed: Nov. 29, 2011

(65) Prior Publication Data

US 2012/0149242 A1    Jun. 14, 2012

(30) Foreign Application Priority Data

Dec. 8, 2010 (JP) .................. 2010-273574

(51) Int. Cl.
*H01R 4/50* (2006.01)
(52) U.S. Cl.
USPC ........................................... 439/345
(58) Field of Classification Search
USPC .............. 439/345, 752, 493, 367, 587, 274, 439/607.01; 257/417, 419, 687
See application file for complete search history.

(56) References Cited

U.S. PATENT DOCUMENTS

| 5,436,491 | A | * | 7/1995 | Hase et al. ................ 257/417 |
| 6,190,203 | B1 | * | 2/2001 | Murakami et al. ........... 439/587 |
| 7,303,423 | B2 | * | 12/2007 | Hayashi et al. .............. 439/367 |
| 7,534,957 | B2 | * | 5/2009 | Yamaura et al. .............. 174/36 |
| 7,699,646 | B2 | * | 4/2010 | Zhu et al. ..................... 439/493 |
| 8,308,500 | B2 | * | 11/2012 | Davison et al. .............. 439/345 |

FOREIGN PATENT DOCUMENTS

JP    7-302646    11/1995

* cited by examiner

*Primary Examiner* — Alexander Gilman
(74) *Attorney, Agent, or Firm* — Nixon & Vanderhye P.C.

(57) ABSTRACT

A component for an electronic apparatus has an insulating member that has a plurality of through holes in parallel in which the lead wires are inserted and a shield cover in which an insulating member insertion hole where the insulating member is inserted is formed that cut offs an electrical noise. The insulating member is formed in an integrated shape where parts of adjoining cylindrical parts in which the through holes are formed overlapping mutually when seen along an axial direction of the through hole. The insulating member insertion hole becomes a single hole formed identical to an outer shape of the insulating member when seen along the axial direction of the through hole.

6 Claims, 3 Drawing Sheets

COMPONENT FOR ELECTRONIC APPARATUS

CROSS-REFERENCE TO RELATED APPLICATION

This application is based on and claims the benefit of priority from earlier Japanese Patent Application No. 2010-273574 filed Dec. 8, 2010, the description of which is incorporated herein by reference.

TECHNICAL FIELD

The present disclosure relates to a component for an electronic apparatus equipped with a plurality of lead wires connected to electronic components.

BACKGROUND

Conventionally in such a kind of apparatus, a plurality of through holes is formed in an insulating member that has electric insulation, and lead wires or terminals are inserted in the through holes.

Further, electrical noise from outside is cut off by covering surroundings of the insulating member, the lead wires, and the terminals with a shield cover (refer to Japanese Patent Application Laid-Open Publication No. 7-302646, for example).

However, an end side in an axial direction of the through hole (in other words, an end side of a side where the through holes of the insulating member open) of the insulating member is not covered with the shield cover.

By the way, in the component for the electronic apparatus using electronic components, it is necessary to cut off the electrical noise more certainly.

Then, inventors of the present disclosure considered covering the end side in the axial direction of the through hole of the insulating member with the shield cover in order to cut off the electrical noise more certainly in development of an injector equipped with a pressure sensor (electronic component) that detects pressure of fuel supplied to an internal-combustion engine.

FIG. 3A and FIG. 3B show a considered proposal (henceforth the first considered proposal) of the injector that uses two lead wires, and arranges a disk-shaped shield cover 3 to the end side in the axial direction of the through hole of the insulating member 5.

The insulating member 5 has two cylindrical parts 59 in which the through holes 53 are formed, and the cylindrical parts 59 are inserted into insulating-member insertion holes 31 formed in the shield cover 3.

By the way, lead wires, terminals, and waterproofing components are inserted into the through hole 51 (refer to FIG. 1).

FIG. 4 shows another considered proposal (henceforth the second considered proposal) of the injector that uses six lead wires.

The insulating member 5 has six cylindrical parts 59 in which the through holes 53 are formed, and the cylindrical parts 59 are inserted into insulating-member insertion holes 31 formed in the shield cover 3.

Here, since the size of the shield cover 3 is limited, it is possible to open a required number of the insulating-member insertion holes 31 in the shield cover 3 when the number of the lead wires is few.

However, when the number of the lead wires increases, a problem of securing a thickness of an A part becomes difficult, as shown in FIG. 4, occurs, and it becomes impossible to open a required number of the insulating-member insertion holes 31.

Then, an improved proposal (henceforth the third considered proposal) as shown in FIG. 5 is devised.

That is, while the through holes 53 are formed in the plurality of cylindrical parts 59 in the first considered proposal and the second considered proposal, the six through holes 53 are formed in a single substantially rectangular-shaped part of the insulating member 5 in the third considered proposal.

Moreover, an insulating-member insertion hole 31 of the shield cover 3 is also a single substantially rectangular-shaped hole.

Further, by configuring pitches between the adjoining through holes 53 small (that is, arranging closely), a space that forms the insulating-member insertion hole 31 in the third considered proposal becomes small than a space that forms the six insulating member insertion holes 31 in the second considered proposal.

As a result, it becomes possible to form the insulating-member insertion hole 31 in the small shield cover 3, and can solve the problem of the second considered proposal.

However, when the insulating-member insertion hole 31 is formed into the substantially rectangular shape as in the third considered proposal, increase of the area that is not covered with the shield cover 3 becomes a new problem.

SUMMARY

An embodiment provides a component for an electronic apparatus that allows forming an insulating member insertion hole in a small shield cover, and allows increasing an area covered with the shield cover.

In a component for an electronic apparatus according to a first aspect, the component for the electronic apparatus includes a plurality of lead wires connected to an electronic component, an insulating member having electric insulation that has a plurality of through holes in parallel in which the lead wires are inserted, and a shield cover in which an insulating member insertion hole where the insulating member is inserted is formed that cut offs an electrical noise; wherein.

The insulating member is formed in an integrated shape where parts of adjoining cylindrical parts in which the through holes are formed overlapping mutually when seen along an axial direction of the through hole, and the insulating member insertion hole becomes a single hole formed identical to an outer shape of the insulating member when seen along the axial direction of the through hole.

Accordingly, since the insulating member insertion hole can be made small by configuring pitches between the adjoining through holes small, the insulating member insertion hole can be formed also in the small shield cover.

In addition, an area covered with the shield cover can be increased compared with the case where the insulating-member insertion hole is formed into a substantially rectangular shape.

In the component for the electronic apparatus according to a second aspect, the shield cover is insert-molded with the insulating member.

Additionally, when press-fitting the insulating member with the shield cover to be integrated, it is necessary to thicken thickness of the insulated component so that the load at the time of press-fitting can be rested.

As a result, an area of the insulating member when seen along an axial direction of the through hole increases, and electric noise that passes through the insulated component will increase.

On the other hand, when insert-molding the second shield cover with the insulating member to be integrated, thickness of the insulating member can be made thinner than the case of press-fitting.

Therefore, an opening area of the insulating-member insertion hole becomes smaller than the case of press-fitting, thus the electrical noise that passes the insulating member can be reduced.

In the component for the electronic apparatus according to a third aspect, the shield cover is press-fit into the insulating member.

In the component for the electronic apparatus according to a fourth aspect, there is provided a terminal that connects the lead wire with the electronic component, and the terminal is disposed in the through hole.

In the component for the electronic apparatus according to a fifth aspect, there is provided a waterproofing component formed cylindrical by rubber in which the lead wires are inserted that is inserted into the through hole.

In the component for the electronic apparatus according to a sixth aspect, the electronic component is a pressure sensor that detects a pressure of a fuel injected to an internal-combustion engine.

DETAILED DESCRIPTION OF THE PREFERRED EMBODIMENTS

With reference to the drawings, hereinafter will be described an embodiment of the present disclosure.

Figure 1:
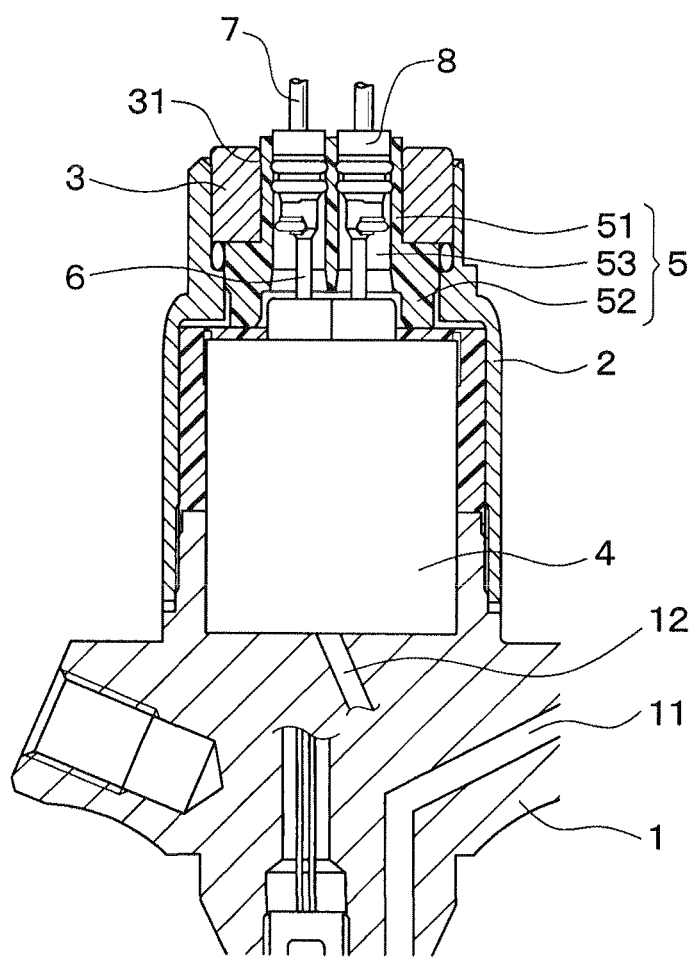
FIG. 1 shows a schematic sectional view of a principal part of an injector in an embodiment of the present disclosure.

As shown in FIG. 1, an injector as a component for an electronic apparatus injects high-pressure fuel supplied from a common-rail (not shown) into a cylinder of a diesel internal-combustion engine. A high-pressure fuel passage 11 where the high-pressure fuel flows is formed in an injector body 1.

A cylindrical first shield cover 2 is screwed to an end of the injector body 1. A disk-like second shield cover 3 is press-fixed at an opening end of the first shield cover 2.

In addition, the injector body 1, the first shield cover 2, and the second shield cover 3 are formed by a metal that is abundant in electromagnetic shielding nature, in order to cut off electrical noise.

A pressure sensor 4 that detects the fuel pressure of the high-pressure fuel passage 11 and an insulating member 5 made of resin that is abundant in electric insulation nature are arranged in a space surrounded by the injector body 1, the first shield cover 2, and the second shield cover 3.

The pressure sensor 4 as an electronic component has a sensor chip that changes resistance value according to the pressure of the fuel led through a branch passage 12 branched from the high-pressure fuel passage 11, an IC for signal-processing circuits that outputs a sensor signal according to the pressure of the fuel based on the resistance value change of the sensor chip, and the like therein (not shown).

The IC for signal-processing circuits is electrically connected with a plurality of lead wires 7 via terminals 6.

The lead wires 7 are used for supplying power to the IC for signal-processing circuits, for grounding, and for a sensor signal output, etc.

Figure 2B:
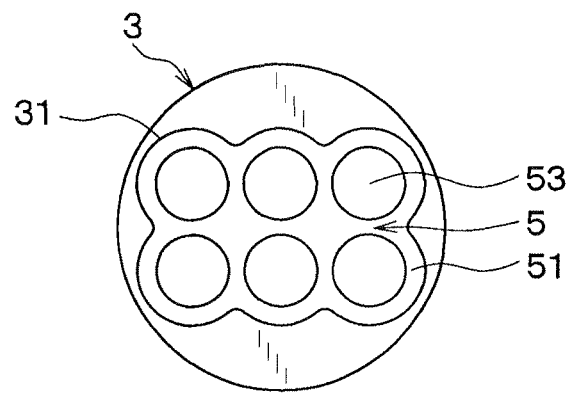
FIG. 2B shows a plan view of FIG. 2A.
Figure 2A:
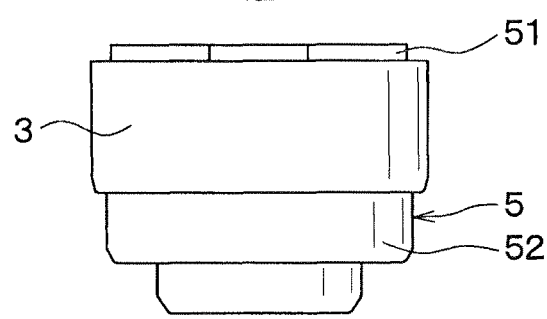
FIG. 2A shows an elevational view of an insulating member and a shield cover of FIG. 1.
Figure 3B:
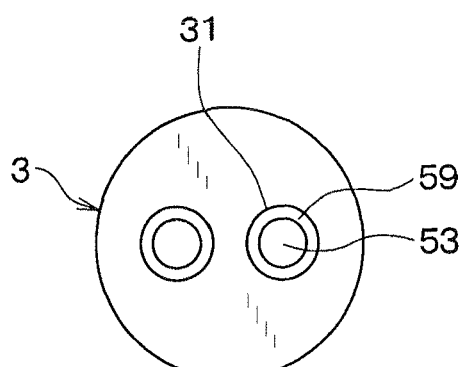
FIG. 3A shows a front sectional view of a principal part of a first considered proposal of an injector that inventors of the present disclosure considered, and FIG. 3B show a plan view of FIG. 3A.
Figure 3A:
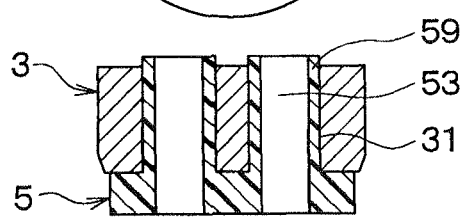

As shown in FIG. 1 and FIG. 2, the insulating member 5 is has a first cylinder part 51 inserted in an insulating-member insertion hole 31 (details will be mentioned later) of the second shield cover 3, and a second cylinder part 52 that is located in an exterior of the insulating-member insertion hole 31 and contacts to an end surface of the second shield cover 3.

Furthermore, a plurality of (six in the present embodiment) through holes 53 in which the terminals 6, the lead wires 7, and waterproofing components 8 are inserted are formed in parallel.

Figure 4:
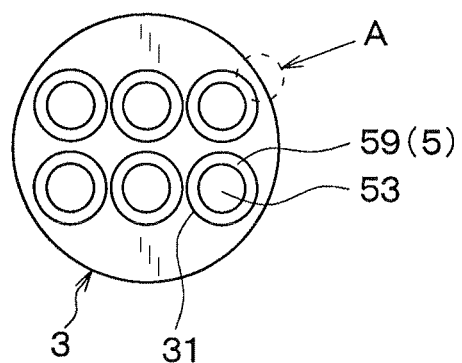
FIG. 4 shows a plan view of a principal part of a second considered proposal of an injector that the inventors of the present disclosure considered.

Moreover, pitches between the adjoining through holes 53 are smaller than those of the second considered proposal of FIG. 4. Thereby, the first cylinder part 51 is formed in an integrated shape where parts of the adjoining cylindrical parts in which the through holes 53 are formed overlapping mutually when seen along an axial direction of the through hole (refer to FIG. 2B).

In another words, an outer shape of the first cylinder part 51 is a form that arced curved surfaces of each coaxial through hole 53 continue.

The insulating-member insertion hole 31 of the second shield cover 3 is formed identical to an outer shape of the first cylinder part 51 when seen along the axial direction of the through hole.

That is, the insulating-member insertion hole 31 becomes a single hole in which the part of the adjoining coaxial circular holes overlap mutually with the each through hole 53 when seen along the axial direction of the through hole.

In another words, a shape of the insulating-member insertion hole 31 is a form that arced curved surfaces of each coaxial through hole 53 continue.

By the way, the second shield cover 3 may be insert-molded with the insulating member 5 to be integrated, or the first cylinder part 51 may be press-fit into the second shield cover 3 to be integrated.

The waterproofing components 8 are formed cylindrical by rubber, and while the lead wires 7 are inserted inside, outer circumferential surfaces are in contact with the through holes 53.

The injector with the composition mentioned above, sensor signal according to the fuel pressure detected by the pressure sensor 4 is outputted to an ECU for engine control via the lead wires 7.

At this time, the electrical noise entering to the space where the pressure sensor 4 is disposed is prevented by the injector body 1, the first shield cover 2, and the second shield cover 3.

Further, in the present embodiment, since the insulating-member insertion holes 31 are made small by making the pitched between the adjoining through holes 53 small, the insulating-member insertion holes 31 can be formed even if the second shield cover 3 is small.

Figure 5:
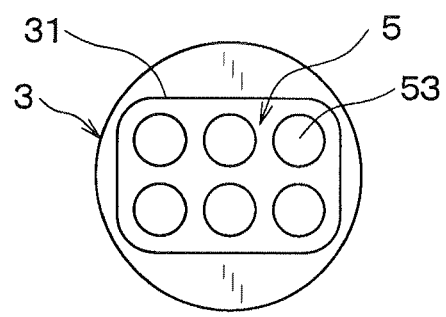
FIG. 5 shows a plan view of a principal part of a third considered proposal of an injector that the inventors of the present disclosure considered.

Moreover, the area covered with the second shield cover 3 can be increased compared with the case where the insulating-member insertion holes 31 are made into the substantially rectangular-shape like the third considered proposal of FIG. 5.

Furthermore, when insert-molding the second shield cover 3 with the insulating member 5 to be integrated, thickness of the first cylinder part 51 can be made thinner than the case of press-fitting.

As a result, an opening area of the insulating-member insertion hole 31 becomes smaller than the case of press-fitting, thus the electrical noise that passes the insulating member 5 can be reduced.

Furthermore, since the terminals 6 are disposed in the through holes 53, the electric insulation between the terminals 6 and the second shield cover 3 is secured by the insulating member 5.

Furthermore, infiltration of moisture from the through hole 53 can be prevented by the waterproofing components 8.

Although the present disclosure is applied to the injector in the present embodiment, the present disclosure is applicable also to components for the electronic apparatus other than the injector.

Moreover, although the pressure sensor 4 is shown as an electronic component in the present embodiment, the present disclosure is applicable also to components for the electronic apparatus equipped with electronic components other than pressure sensor 4.

What is claimed:

1. A component for an electronic apparatus comprising:
   a plurality of lead wires connected to an electronic component;
   an insulating member having electric insulation that has a plurality of through holes in parallel in which the lead wires are inserted and each of the through holes is surrounded cylindrically by the insulating member to form a cylindrical part; and
   a shield cover in which an insulating member insertion hole where the insulating member is inserted is formed that cut offs an electrical noise; wherein,
   the insulating member is formed in an integrated shape where parts of adjoining cylindrical parts in which the through holes are formed overlapping mutually when seen along an axial direction of the through hole, and
   the insulating member insertion hole becomes a single hole formed identical to an outer shape of the insulating member when seen along the axial direction of the through hole.

2. The component for the electronic apparatus according to claim 1, wherein, the shield cover is insert-molded with the insulating member.

3. The component for the electronic apparatus according to claim 1, wherein, the shield cover is press-fit into the insulating member.

4. The component for the electronic apparatus according to claim 1, wherein, there is provided a terminal that connects the lead wire with the electronic component, and the terminal is disposed in the through hole.

5. The component for the electronic apparatus according to claim 1, wherein, there is provided a waterproofing component formed cylindrical by rubber in which the lead wires are inserted that is inserted into the through hole.

6. The component for the electronic apparatus according to claim 1, wherein, the electronic component is a pressure sensor that detects a pressure of a fuel injected to an internal-combustion engine.

* * * * *